US00RE38282E

(19) United States
(12) Reissued Patent
Allen et al.

(10) Patent Number: US RE38,282 E
(45) Date of Reissued Patent: Oct. 21, 2003

(54) PROCESS FOR USING BILAYER PHOTORESIST

(75) Inventors: Robert David Allen, San Jose, CA (US); Donald Clifford Hofer, San Martin, CA (US); Ratnam Sooriyakumaran, San Jose, CA (US); Gregory Michael Wallraff, Morgan Hill, CA (US)

(73) Assignee: International Business Machines Corporation, Armonk, NY (US)

(21) Appl. No.: 09/895,624

(22) Filed: Jun. 28, 2001

Related U.S. Patent Documents

Reissue of:
(64) Patent No.: 5,985,524
Issued: Nov. 16, 1999
Appl. No.: 08/828,921
Filed: Mar. 28, 1997

(51) Int. Cl.[7] ..... G03F 7/004; G03C 5/16
(52) U.S. Cl. ..... 430/326; 430/273.1; 430/156; 430/166; 430/323; 430/270.1; 430/905; 430/910
(58) Field of Search ..... 430/275.1, 270.1, 430/281.1, 326, 156, 166, 323, 910, 905

(56) References Cited

U.S. PATENT DOCUMENTS

| | | | | |
|---|---|---|---|---|
| 2,438,612 | A | | 3/1948 | MacKenzie et al. |
| 2,985,631 | A | | 5/1961 | Jones et al. |
| 3,179,612 | A | | 4/1965 | Plueddemann |
| 3,467,634 | A | | 9/1969 | Jacknow et al. |
| 3,746,734 | A | | 7/1973 | Berger et al. |
| 3,870,766 | A | | 3/1975 | Chadha |
| 4,398,007 | A | | 8/1983 | Kubota et al. |
| 4,481,049 | A | * | 11/1984 | Reichmanis et al. ..... 156/643 |
| 4,491,508 | A | | 1/1985 | Olson et al. |
| 4,564,576 | A | * | 1/1986 | Saigo et al. |
| 4,788,127 | A | * | 11/1988 | Bailey et al. ..... 430/192 |
| 4,910,255 | A | * | 3/1990 | Wakabayashi et al. |
| 4,999,280 | A | * | 3/1991 | Hiraoka |
| 5,045,431 | A | * | 9/1991 | Allen et al. |
| 5,068,169 | A | * | 11/1991 | Takechi et al. ..... 430/313 |
| 5,071,730 | A | * | 12/1991 | Allen et al. |
| 5,085,972 | A | * | 2/1992 | Vogel ..... 430/270.1 |
| 5,204,226 | A | * | 4/1993 | Baier et al. |
| 5,219,705 | A | * | 6/1993 | Kato et al. |
| 5,229,435 | A | * | 7/1993 | Sakai et al. |
| 5,236,968 | A | * | 8/1993 | Hirschmann |
| 5,326,584 | A | * | 7/1994 | Kamel et al. |
| 5,326,670 | A | * | 7/1994 | Kotachi et al. ..... 430/296 |
| 5,332,648 | A | * | 7/1994 | Kihara et al. ..... 430/270.1 |
| 5,336,797 | A | * | 8/1994 | McGee et al. |
| 5,552,260 | A | * | 9/1996 | Vogel et al. ..... 430/270.1 |
| 5,580,694 | A | * | 12/1996 | Allen et al. |
| 5,665,527 | A | * | 9/1997 | Allen et al. ..... 430/325 |
| 5,856,071 | A | * | 1/1999 | Kotachi et al. ..... 430/326 |

FOREIGN PATENT DOCUMENTS

| | | |
|---|---|---|
| JP | 61-235843 | 10/1986 |
| JP | 02-227408 | 9/1990 |
| JP | 08-160651 | 6/1996 |

OTHER PUBLICATIONS

Reichmanis et al., "Chemical Amplification Mechanisms for Microlithograph", pp. 394–407, 1991.*
Lamola et al. "Chemically Amplified Resists", pp. 53–60, Aug. 1991.*
R. D. Miller "Polymeric Silicon–Containing Resist Materials", Advanced Materials for Optics and Electronics, vol. 4, 1994, pp. 95–127.*

* cited by examiner

*Primary Examiner*—Rosemary Ashton
(74) *Attorney, Agent, or Firm*—Reed & Eberle LLP

(57) ABSTRACT

The invention relates to a process for forming bilayer resist images with a chemically-amplified, radiation-sensitive bilayer resist. The bilayer resist is disposed on a substrate and comprises (i) a top imaging layer comprising a radiation-sensitive acid generator and a vinyl polymer having an acid-cleavable silylethoxy group and (ii) an organic underlayer. The bilayer resist is used in the manufacture of integrated circuits.

71 Claims, No Drawings

PROCESS FOR USING BILAYER PHOTORESIST

Matter enclosed in heavy brackets [ ] appears in the original patent but forms no part of this reissue specification; matter printed in italics indicates the additions made by reissue.

FIELD OF THE INVENTION

The present invention relates to an improved bilayer photoresist and process for its use in lithography for manufacturing semiconductor devices.

BACKGROUND OF THE INVENTION

There is a desire in the industry for higher circuit density in microelectronic devices made using lithographic techniques. One method of achieving higher area density is to improve the resolution of circuit patterns in resist films. It is known in the art that increasing the numerical aperture (NA) of the lens system of the lithographic imaging tool increases the resolution at a given wavelength. However, increasing the NA results in a decrease in the depth of focus (DOF) of the imaging radiation, thereby requiring a reduction in the thickness of the imaging resist film. Further, the industry-wide shift to shorter wavelength exposure systems also results in a decrease in the DOF. A decrease in the resist film thickness can lead to problems in subsequent processing steps (e.g., ion implantation and etching).

In order to overcome these problems, bilayer resists have been developed. Bilayer resists generally comprise a top thin film imaging layer coated on a thick organic underlayer. The resist is patterned by: (i) imagewise exposure and development of the top layer, and then (ii) anisotropically transferring the developed pattern in the top layer through the thick underlayer to the substrate. Suitably, the top layer contains precursors to refractory oxides such as silicon, boron, or germanium which enable the use of oxygen-reactive ion etching (RIE) in the image transfer step. However, the incorporation of silicon into the photoresist film often leads to the degradation of resolution and imaging performance.

Bilayer resists are known in the art. However, these resists were generally developed before the advent of deep U.V. lithography (e.g., 248 nm and 193 nm) and are of little utility for high-resolution imaging. For example, in the review article "Polymeric Silicon-containing Resist Materials", Advanced Material for Optics and Electronics, Vol. 4, pp. 95–127 (1994), there is disclosed on page 112 a positive bilayer resist having a top layer comprising the copolymer poly(co-trimethylsilylmethyl methacrylate and monooximido $\alpha$ diketone). The top layer is imaged by radiation chain scission and the image is transferred with oxygen R.I.E. However, the resist is not commercially viable due to slow photospeed and other resist performance problems. Therefore, there still is a need in the art for a bilayer photoresist suitable for commercial use.

It is therefore an object of the present invention to provide an improved bilayer photoresist.

Other objects and advantages will become apparent from the following disclosure.

SUMMARY OF THE INVENTION

The present invention relates to a process for forming bilayer resist images on a substrate with a chemically-amplified, radiation-sensitive bilayer resist. The bilayer resist is disposed on a substrate and comprises (i) a top imaging layer comprising a radiation-sensitive acid generator and a vinyl polymer or copolymer formed by the polymerization of monomers, including one or more monomers selected from acrylate, methacrylate, hydroxystyrene (optionally substituted with $C_{1-6}$ alkyl), and $C_{5-20}$ cyclic olefin monomers, where preferably the polymer has an acid-cleavable silylethoxy group; and (ii) an organic underlayer. The present invention relates to the process for using the bilayer resist to make resist images in a film in the manufacture of integrated circuits.

A more thorough disclosure of the present invention is presented in the detailed description which follows.

DESCRIPTION OF THE PREFERRED EMBODIMENT

The present invention relates to a positive tone, chemically-amplified, radiation-sensitive bilayer resist. The bilayer resist comprises (a) a top imaging layer comprising (i) a radiation-sensitive acid generator; (ii) a vinyl polymer or copolymer formed by the polymerization of one or more monomers, including a monomer selected from acrylate, methacrylate, hydroxystyrene (optionally substituted with $C_{1-6}$ alkyl), and $C_{5-20}$ cyclic olefin monomers (preferably $C_{7-15}$, e.g., norbornene and tetracyclododecane); and (iii) a compound having a silylethoxy acid-cleavable group; and (b) a polymeric organic underlayer. The ethoxy portion of the silylethoxy group is optionally substituted with $C_{1-6}$ alkyl, phenyl, or benzyl. The vinyl polymer may optionally comprises other types of monomers known to those skilled in the art. Preferably, the silicon-containing, acid-cleavable group is bonded to the vinyl polymer.

The resist is chemically amplified in that the proton produced in the photoreaction of the radiation-sensitive acid generator initiates catalytic cleavage reactions of the acid-cleavable group independent of the radiation, thereby increasing the effective quantum yield to values above 1.

The silicon-containing, acid-cleavable group consists of silicon atoms, carbon atoms, hydrogen atoms, and one oxygen atom. Suitable acid-cleavable silylethoxy groups have the formula $R_1\ R_2\ R_3\ Si\ (CR'_2)_2O$, where each R' is independently hydrido, $C_{1-6}$ alkyl (e.g., methyl), phenyl, or benzyl optionally substituted with $C_{1-6}$ alkyl and $R_1$, $R_2$, and $R_3$ are each independently hydrido, alkyl preferably lower ($C_{1-6}$) alkyl or $(R_4)_3$ Si, where each $R_4$is independently hydrido or lower alkyl. Preferred silicon-containing, acid-cleavable groups are $C_{1-6}$ alkyl silylethoxy; mono, bis, tris ($C_{1-6}$ alkyl silyl) silylethoxy. The bridging alkylene $(CR_2')_2$ group is important in that it enables nonhydrolytic, solid state, acid-catalyzed cleavable of the acid-cleavable group which is believed to occur through the formation of a beta silyl carbocation as a cleaving group. The top imaging layer of the present invention is not crosslinked (uncrosslinked) and has a high silicon content to give enhanced stability against reactive ion etching. The top imaging layer is also hydrolytically stable and the top layer composition has enhanced shelf stability.

In one embodiment of the present invention, the top imaging layer comprises a radiation-sensitive acid generator and an acrylate or methacrylate polymer having an acid-cleavable, silicon-containing group (e.g., silylethoxy) attached to the carbonyl of the acrylate or methacrylate.

The silicon-containing acrylate or methacrylate can be used as a homopolymer or can be a copolymer. Suitable comonomers include (i) acrylate or methacrylate monomers with lower alkyl ester groups, (ii) acrylic acid or methacrylic acid monomers, (iii) methacrylate or acrylate monomers with other types of acid labile ester groups such as tertiary alkyl esters (t-butyl esters), or (iv) hydroxystyrene.

In an alternative embodiment, the polymer in the top imaging layer can be an alicyclic polymer having an alicyclic backbone (e.g., formed from cyclic olefin monomer) where the silicon-containing, acid-cleavable group (e.g., silylethoxy) is preferably bonded to a carbonyl group attached to the cycloalkyl ring. Suitable monomers include functionalized norbornene and tetracyclododecane.

In another alternative embodiment, the top imaging layer comprises a vinyl polymer, an acid generator, and a compound having a silicon-containing, acid-cleavable group. Suitable compounds are bisphenol A and steroids (e.g., substituted androstane as disclosed in Allen et al., U.S. Pat. No. 5,580,694, issued Dec. 3, 1996, the disclosure of which is incorporated herein by reference for all purposes). Other suitable compounds will be known to those skilled in the art.

In another alternative embodiment, the polymer in the top imaging layer is polyhydroxystyrene where the silicon-containing, acid-cleavable group (e.g., silylethoxy) is bonded directly to the aromatic ring (e.g., as a protected hydroxy substituent).

The second component of the top imaging layer is the radiation-sensitive acid generator. Upon exposure to radiation, the radiation-sensitive acid generator generates an acid. Suitable acid generators include triflates (e.g., triphenylsulfonium triflate or bis-(t-butyl phenyl) iodonium triflate), pyrogallol (e.g., trimesylate of pyrogallol), onium salts such a triarylsulfonium and diaryl iodonium hexafluoroantimonates, hexafluoroarsenates, trifluoromethane sulfonates and others; iodonium sulfonates and trifluoromethanesulfonate esters of hydroxyimides, alpha-alpha'-bis-sulfonyl diazomethanes, sulfonate esters of nitro-substituted benzyl alcohols and napthoquinone-4-diazides and alkyl disulfones. Other suitable photoacid generators are disclosed in Allen's U.S. Pat. Nos. 5,045,431 and 5,071,730, and Reichmanis et al.'s review article (Chemistry of Materials, Vol. 3, page 395 (1991)), the disclosures of which are incorporated herein by reference for all purposes.

The two-component top imaging layer generally comprises about 1 to 10 weight % of the acid generator and about 90 to 99 weight % of the polymer. The top imaging layer may optionally comprise other minor components such as dissolution inhibitors, coating enhancers, surfactants, bases, and other compounds known to those skilled in the art.

Suitable organic, polymeric, planarizing underlayers for the resist of the present invention include hard-baked diazonaphthoquinone (DNQ) novolac, polyimides, polyesters, polyacrylates and the like. DNQ novolac is the preferred polymer for the underlayer. Other crosslinkable polymers known to those skilled in the art can also be used as the underlayer.

The present invention relates to a process for generating a positive bilayer resist image on a substrate comprising the steps of: (a) coating a substrate with an organic underlayer; (b) coating the organic underlayer with a top layer comprising a radiation-sensitive acid generator and a vinyl polymer having a silicon-containing, acid-cleavable group; (c) imagewise exposing the top layer to radiation; (d) developing the image in the top layer; and (e) transferring the image through the organic underlayer to the substrate.

The first step of the process of the present invention involves coating the substrate with a layer comprising an organic polymer dissolved in a suitable solvent. Suitable substrates are comprised of silicon. Suitably, the surface of the substrate is cleaned by standard procedures before the layer is disposed thereon. Suitable solvents for the organic polymer underlayer include propylene glycol methyl ether acetate. The layer can be coated on the substrate using art-known techniques such as spin or spray coating, or doctor blading. The layer is then heated to an elevated temperature of about 100–250° C. for a short period of time of about 1–30 minutes to drive off solvent and optionally thermally induce crosslinking. The dried underlayer layer has a thickness of about 0.5–20 microns, preferably about 1 micron.

In the second step of the process, the components of the top imaging layer are dissolved in a suitable solvent such as propylene glycol methyl ether acetate (AMGA) and coated onto the underlayer of organic polymer. It is desired that the imaging layer not admix with the underlayer layer during the coating process. The top layer has a thickness of about 0.1 to 0.3 microns.

In the next step of the process, the film stack (the top layer and underlayer) is imagewise exposed to radiation, suitably electromagnetic radiation or electron beam radiation, preferably ultraviolet radiation suitably at a wavelength of about 190–365 nm (193/248/254/365/x-ray—hard and soft, e.g., euv 13 nm), preferably 193 or 248 nm. Suitable radiation sources include mercury, mercury/xenon, and xenon lamps. The preferred radiation source is ArF excimer or KrF excimer. At longer wavelengths (e.g., 365 nm) a sensitizer may be added to the top imaging layer to enhance absorption of the radiation. Conveniently, due to the enhanced radiation sensitivity of the top layer of the resist film, the top layer of the film has a fast photospeed and is fully exposed with less than about 100 $mJ/cm^2$ of radiation, more preferably less than about 50 $mJ/cm^2$. The radiation is absorbed by the radiation-sensitive acid generator or sensitizing agent to generate free acid which causes cleavable of the silicon-containing, acid-cleavable group and formation of the corresponding carboxylic acid or phenol.

Preferably, after the film has been exposed to radiation, the film is again heated to an elevated temperature of about 90–120° C. for a short period of time of about 1 minute.

The next step involves development of an image in the top layer with a suitable solvent. Suitable solvents for development of a high contrast, positive image include an aqueous base, preferably an aqueous base without metal ions such as tetramethyl ammonium hydroxide or choline. The development results in removal of the exposed areas of the top layer of the film.

The last step of the process involves transferring of the developed image in the top layer through the underlayer to the substrate by known techniques. Preferably, the image is transferred by etching with reactive ions such as plasma etching and reactive ion etching. Suitable plasma tools include electron cyclotron resonance (ECR), helicon, inductively coupled plasma (ICP), and transmission-coupled plasma (TCP) systems. Suitably, oxygen-reactive ion etching (magnetically enhanced) is utilized to transfer the image through the underlayer. Etching techniques are well known in the art and equipment is commercially available to etch films. The developed film has high aspect ratio, high etch resistance, enhanced resolution, and straight wall profiles.

The bilayer resist of the present invention may be used to make an integrated circuit assembly, such as an integrated circuit chip, multichip module, circuit board, or thin film magnetic heads. The integrated circuit assembly comprises a circuit formed on a substrate by using the process of the present invention, and then additionally forming a circuit in the developed film on the substrate by art-known techniques.

After the substrate has been exposed, circuit patterns can be formed in the exposed areas by coating the substrate with a conductive material such as conductive metals by art-known dry-etching techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of the resist of the present invention. The detailed preparations fall within the scope of, and serve to exemplify, the more generally described methods set forth above. The examples are presented for illustrative purposes only, and are not intended as a restriction on the scope of the invention.

EXAMPLE I

Synthesis of 2-Methacryloxyethyltris(trimethylsilyl) silane (a) Synthesis of 2-Tris(trimethylsilyl)silylethylacetate This material was synthesized as described in the literature: Kopping et al., Journal of Organic Chemistry, Vol. 57, page 3994 (1992).

Tris(trimethylsilyl)silane (Aldrich), (16.20 grams, 0.065 mole), vinyl acetate (4.50 grams, 0.052 mole), azoisobutyronitrile (2.13 grams, 0.013 mole) and 150 ml toluene were placed in a round bottom flask equipped with a water-cooled condenser and a nitrogen inlet. The contents were evaluated and purged with nitrogen four times with the aid of a Firestone valve. The solution was heated at 90° C. for 4.5 hours. The reaction mixture was concentrated in vacuo. Vacuum distillation gave 17 grams of the product at 100–110° C. at 0.5 mm.

(b) Synthesis of 2-Tris(trimethylsilyl)silylethanol

Lithium aluminum hydride (1.30 grams, 0.033 mole) in 150 ml anhydrous ether was refluxed for 1 hour under nitrogen. The suspension was cooled to room temperature and 2-tris(trimethyl-silyl)ethylacetate (8.76 grams, 0.026 mole) in 50 ml ether was added dropwise. The contents were heated under reflux for 4 hours. Cooled to room temperature and 100 ml ice water was added cautiously. Ether layer was washed with 5% sulfuric acid, followed by deionized water, and finally with brine. The solution was dried over anhydrous magnesium sulfate and the solvent was removed in a rotary evaporator. The white solid obtained was dried under vacuum. Yield: 6.5 grams.

(c) Synthesis of 2-Methacryloxyethyltris(trimethylsilyl) silane

Methacryloyl chloride (2.50 grams, 0.024 mole) in 25 ml tetrahydro-furan was added dropwise into a solution of 2-tris(trimethylsilyl) silyl ethanol (6.5 grams, 0.022 mole), pyridine (2.0 grams, 0.025 mole) and 25 mg of phenothiazine in 50 ml tetrahydrofuran at room temperature. Stirred at room temperature for two more hours. The solids were filtered off and the solution was washed with 100 ml brine. The solution was then diluted with 100 ml ether and washed with 5% hydrochloric acid, followed by deionized water, and then with brine. It was dried over anhydrous magnesium sulfate and was concentrated in vacuo. Fractional distillation under reduced pressed gave 5 grams of the product at 105–115° C. at 0.5 mm.

EXAMPLE II

Synthesis of 4-Hydroxystyrene Monomer

4-Acetoxystyrene (105 grams, 0.65 mole) in THF (400 ml) was stirred at room temperature with 14.8 Molar ammonium hydroxide (52 ml, 0.77 mole) for 18 hours. Afterward, the solution was washed three times with brine (250 ml) and dried over anhydrous magnesium sulfate. Solvent was removed in a rotary evaporator and the viscous liquid was dried under high vacuum for 24 hours to give a waxy solid. Typically, this waxy solid is around 90% pure (by NMR), remainder being THF.

EXAMPLE III

Synthesis of Poly(4-hydroxystyrene-co-2-Methacryloxyethyltris(trimethylsilyl)silane 4-Hydroxystyrene (4.80 grams, 0.040 mole) and 2-methacryloxyethyltris(trimethylsilyl)silane (3.80 grams, 0.010 mole) were placed with 25 grams of THF in a round bottom flask equipped with a condenser and a nitrogen inlet. AZO isobutyronitrile (0.33 grams) was added to this solution and stirred until dissolved. Then the solution was evacuated with the aid of a Firestone valve and purged with nitrogen. This was repeated three more times. The contents were then heated to reflux for 18 hours. Afterward, the solution was diluted with acetone (50 ml) and added dropwise into hexanes (1.0 liter). The precipitated polymer was filtered (frit), washed twice with hexanes (100 ml), and dried under vacuum at 60° C. Yield: 5.4 grams.

EXAMPLE V

Bilayer Resist

Several bilayer resist were formed. A silicon substrate was coated with 1.1 microns of novolac resist (Shipley 510L) and then soft baked at 95° C. for 60 seconds, followed by 225° C. for 5 min. The underlayer was overcoated with 2500 Å of a top imaging layer composition comprising about 95 weight % of copolymer-poly (4-hydroxystyrene-co-2-methacyloxyethyltris (trimethyl) silane and about 5 weight % of a photoacid generator di (tert-butyl) iodonium triflate. The films were imagewise exposed at 248 (dose 5–15 mJ/cm$^2$). The film was then baked at 120° C. for 60 seconds and then the top layer developed with 0.263 N tetramethyl ammonium hydroxide. The images were then transferred through the underlayer by reactive ion etching using a LAM etcher. The images formed in the patterned top film showed a vertical wall profile with good process latitude. The image transfer through the underlayer maintains the vertical wall profile. There was minimal erosion of the top resist film during the etch step.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for generating a bilayer resist image on a substrate, comprising the steps of:

(a) coating a substrate with an organic underlayer;

(b) coating the organic underlayer with a top layer comprising (i) a radiation sensitive acid generator, and (ii) a polymer formed by polymerizing a $C_{5-20}$ cyclic olefin monomer optionally in combination with one or more additional monomers selected from the group consisting of acrylate, methacrylate, hydroxystyrene optionally substituted with $C_{1-6}$ alkyl, and combinations thereof, the polymer having an acid-cleavable silylethoxy group attached thereto wherein the ethoxy portion of the silylethoxy group is optionally substituted with $C_{1-6}$ alkyl, phenyl, or benzyl;

(c) imagewise exposing the top layer to radiation;

(d) developing the image in the top layer; and (e) transferring the image through the organic underlayer to the substrate.

2. The process of claim 1 wherein the polymer is a copolymer formed by polymerizing the $C_{5-20}$ cyclic olefin monomer with hydroxystyrene, acrylate, methacrylate, or a combination thereof.

3. The process of claim 2, wherein the polymer is a copolymer formed by polymerizing the $C_{5-20}$ cyclic olefin monomer with acrylate or methacrylate.

4. The process of claim 3 wherein the silylethoxy group is bonded to the acrylate or methacrylate.

5. The process of claim 4 wherein the silylethoxy group is tris ($C_{1-6}$ alkyl silyl) silylethoxy.

6. The process of claim 5 wherein the organic underlayer is diazonaphthoquinone novolac.

7. The process of claim 6 wherein the acid generator is iodonium triflate.

8. The process of claim 7 wherein the top layer is imagewise exposed to radiation having a wavelength of 193 nm or 248 nm.

9. The process of claim 8 wherein the top layer is imagewise exposed to radiation having a wavelength of 193 nm.

10. The process of claim 8 wherein the top layer is imagewise exposed to radiation having a wavelength of 248 nm.

11. The process of claim 2, wherein the polymer is a homopolymer formed by polymerizing the $C_{5-20}$ cyclic olefin monomer in the absence of additional monomers.

12. A process of generating a bilayer resist image on a substrate comprising the steps of:

(a) coating a substrate with an organic underlayer;

(b) coating the organic underlayer with a top layer comprising (i) a radiation-sensitive acid generator, (ii) a polymer formed by polymerizing a $C_{5-20}$ cyclic olefin monomer optionally in combination with one or more additional monomers selected from the group consisting of acrylate, methacrylate, hydroxystyrene optionally substituted with $C_{1-6}$ alkyl, and combinations thereof, and (iii) a compound having an acid-cleavable silylethoxy group;

(c) imagewise exposing the top layer to radiation;

(d) developing the image in the top layer; and (c) transferring the image through the organic underlayer to the substrate.

13. The process of claim 12 wherein the compound of (b)(iii) is an androstane substituted with an acid-cleavable silylethoxy substituent.

14. The process of claim 13 wherein the ethoxy portion of the silylethoxy group is optionally substituted with $C_{1-6}$ alkyl, phenyl, or benzyl.

15. The process of claim 14 wherein the silylethoxy group is tris ($C_{1-6}$ alkyl silyl) silylethoxy.

16. The process of claim 12, wherein the polymer is a copolymer formed by polymerizing the $C_{5-20}$ cyclic olefin monomer with acrylate or methacrylate.

17. The process of claim 12, wherein the polymer is a homopolymer formed by polymerizing the $C_{5-20}$ cyclic olefin monomer in the absence of additional monomers.

18. The process of claim 12, wherein the top layer is imagewise exposed to radiation having a wavelength of 193 nm or 248 nm.

19. The process of claim 18 wherein the top layer is imagewise exposed to radiation having a wavelength of 193 nm.

20. The process of claim 18 wherein the top layer is imagewise exposed to radiation having a wavelength of 248 nm.

[21. A process for generating a bilayer resist image on a substrate, comprising the steps of:

(a) coating a substrate with an organic underlayer;

(b) coating the organic underlayer with a top layer comprising (i) a radiation sensitive acid generator, and (ii) a polymer formed by polymerizing one or more monomers selected from the group consisting of acrylate, methacrylate, hydroxystyrene optionally substituted with $C_{1-6}$ alkyl, $C_{5-20}$ cyclic olefin monomers, and combinations thereof, the polymer having acid-cleavable moieties bound thereto, wherein all such moieties are silylethoxy groups optionally substituted on the ethoxy portion thereof with $C_{1-6}$ alkyl, phenyl, or benzyl;

(c) imagewise exposing the top layer to radiation;

(d) developing the image in the top layer; and (e) transferring the image through the organic underlayer to the substrate.]

[22. The process of claim 21 wherein the polymer is a copolymer formed by polymerizing the $C_{5-20}$ cyclic olefin monomer with hydroxystyrene, acrylate, methacrylate, or a combination thereof.]

[23. The process of claim 22, wherein the polymer is a copolymer formed by polymerizing the $C_{5-20}$ cyclic olefin monomer with acrylate or methacrylate.]

[24. The process of claim 23, wherein the silylethoxy group is bonded to the acrylate or methacrylate.]

[25. The process of claim 21, wherein the polymer is a homopolymer formed by polymerizing the $C_{5-20}$ cyclic olefin monomer in the absence of additional monomers.]

[26. The process of claim 21, wherein the top layer is imagewise exposed to radiation having a wavelength of 193 nm or 248 nm.]

[27. The process of claim 26 wherein the top layer is imagewise exposed to radiation having a wavelength of 193 nm.]

[28. The process of claim 26 wherein the top layer is imagewise exposed to radiation having a wavelength of 248 nm.]

29. A process for generating a bilayer resist image on a substrate, comprising the steps of:

(a) coating a substrate with an organic underlayer[.] *;*

(b) coating the organic underlayer with a top layer comprising a radiation-sensitive acid generator and a polymer formed by copolymerizing (i) hydroxystyrene optionally substituted with $C_{1-6}$ alkyl with (ii) a second monomer selected from the group consisting of acrylic acid and methacrylic acid substituted with an acid-cleavable silylethoxy group, wherein the ethoxy portion of the silylethoxy group is substituted with 0 to 4

$C_{1-6}$ alkyl, phenyl, or benzyl groups, and[, optionally,] with (iii) a third monomer [optionally] substituted with an acid-cleavable group;

(c) imagewise exposing the top layer to radiation;

(d) developing the image in the top layer; and (e) transferring the image through the organic underlayer to the substrate.

30. The process of claim 29, wherein the second monomer has the structure

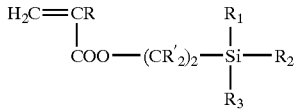

wherein R is hydrido or methyl, the R' are independently hydrido, $C_{1-6}$ alkyl, phenyl, or benzyl, and $R_1$, $R_2$ and $R_3$ are independently selected from the group consisting of hydrido, $C_{1-6}$ alkyl and $Si(R_4)_3$ wherein $R_4$ is independently hydrido or lower alkyl.

31. The process of claim 30, wherein R is methyl.

[32. The process of claim 30, wherein the polymer is formed by copolymerization of the first, second and third monomers.]

[33. The process of claim 32, wherein the third monomer is substituted with an acid-cleavable group.]

34. The process of claim [33] *29*, wherein the third monomer is acrylic acid or methacrylic acid substituted with an acid-labile ester group.

35. The process of claim 34, wherein the acid-labile ester group is t-butyl ester.

36. The process of claim 35, wherein the R' are independently hydrido or $C_{1-6}$ alkyl.

37. The process of claim 36, wherein all R' are hydrido.

*38. A process for preparing a composition useful as an upper layer in a bilayer resist, comprising:*

*admixing (a) a radiation sensitive acid generator and (b) a polymer comprising $C_{5-20}$ cyclic olefin monomer and optionally one or more additional monomers selected from the group consisting of acrylate, methacrylate, hydroxystyrene optionally substituted with $C_{1-6}$ alkyl, and combinations thereof, said polymer having an acid-cleavable silylethoxy group attached thereto wherein the ethoxy portion of the silylethoxy group is optionally substituted with $C_{1-6}$ alkyl, phenyl, or benzyl.*

*39. The process of claim 38, wherein the polymer is a copolymer comprising (i) $C_{5-20}$ cyclic olefin monomer and (ii) a monomer selected from the group consisting of hydroxystyrene, acrylate, methacrylate, and combinations thereof.*

*40. The process of claim 39, wherein the polymer is a copolymer comprising (i) $C_{5-20}$ cyclic olefin monomer and (ii) a monomer selected from the group consisting of acrylate and methacrylate.*

*41. The process of claim 40 wherein the silylethoxy group is bonded to the acrylate or methacrylate.*

*42. The process of claim 41 wherein the silylethoxy group is tris ($C_{1-6}$ alkyl silyl) silylethoxy.*

*43. The process of claim 39, wherein the polymer is a homopolymer formed by polymerizing the $C_{5-20}$ cyclic olefin monomer in the absence of additional monomers.*

*44. The process of claim 38 wherein the acid generator is iodonium triflate.*

*45. The process of claim 38, wherein said admixing is carried out in a solvent for the acid generator and polymer.*

*46. A process for preparing a composition useful as an upper layer in a bilayer resist, said process comprising:*

*admixing (a) a radiation sensitive acid generator, (b) a polymer comprising $C_{5-20}$ cyclic olefin monomer and optionally one or more additional monomers selected from the group consisting of acrylate, methacrylate, hydroxystyrene optionally substituted with $C_{1-6}$ alkyl, and combinations thereof, and (c) a compound having an acid-cleavable silylethoxy group.*

*47. The process of claim 46 wherein the compound of (c) is an androstane substituted with an acid-cleavable silylethoxy substituent.*

*48. The process of claim 47 wherein the ethoxy portion of the silylethoxy group is optionally substituted with $C_{1-6}$ alkyl, phenyl, or benzyl.*

*49. The process of claim 48 wherein the silylethoxy group is tris ($C_{1-6}$ alkyl silyl) silylethoxy.*

*50. The process of claim 46, wherein the polymer is a copolymer comprising (i) $C_{5-20}$ cyclic olefin monomer and (ii) a monomer selected from the group consisting acrylate and methacrylate.*

*51. The process of claim 46, wherein the polymer is a homopolymer formed by polymerizing the $C_{5-20}$ cyclic olefin monomer in the absence of additional monomers.*

*52. The process of claim 46, wherein said admixing is carried out in a solvent for the acid generator and polymer.*

*53. A process for preparing a composition useful as an upper layer in a bilayer resist, comprising the steps of:*

*admixing (a) a radiation sensitive acid generator and (b) a polymer comprising (i) hydroxystyrene optionally substituted with $C_{1-6}$ alkyl, (ii) a second monomer selected from the group consisting of acrylic acid and methacrylic acid substituted with an acid-cleavable silylethoxy group, wherein the ethoxy portion of the silylethoxy group is substituted with 0 to 4 $C_{1-6}$ alkyl, phenyl, or benzyl groups, and (iii) a third monomer substituted with an acid-cleavable group.*

*54. The process of claim 53, wherein the second monomer has the structure*

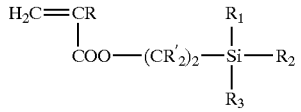

*wherein R is hydrido or methyl, the R' are independently hydrido, $C_{1-6}$ alkyl, phenyl, or benzyl, and $R_1$, $R_2$ and $R_3$ are independently selected from the group consisting of hydrido, $C_{1-6}$ alkyl and $Si(R_4)_3$ wherein $R_4$ is independently hydrido or lower alkyl.*

*55. The process of claim 54, wherein R is methyl.*

*56. The process of claim 53, wherein the third monomer is acrylic acid or methacrylic acid substituted with an acid-labile ester group.*

*57. The process of claim 56, wherein the acid-labile ester group is t-butyl ester.*

*58. The process of claim 57, wherein the R' are independently hydrido or $C_{1-6}$ alkyl.*

*59. The process of claim 58, wherein all R' are hydrido.*

*60. The process of claim 53, wherein the admixing is carried out in a solvent for the acid generator and polymer.*

*61. A composition useful as an upper layer in a bilayer resist, comprising:*

*(a) a radiation sensitive acid generator, and*

*(b) a polymer comprising a $C_{5-20}$ cyclic olefin monomer and optionally one or more additional monomers*

*selected from the group consisting of acrylate, methacrylate, hydroxystyrene optionally substituted with $C_{1-6}$ alkyl, and combinations thereof, said polymer having an acid-cleavable silylethoxy group attached thereto wherein the ethoxy portion of the silylethoxy group is optionally substituted with $C_{1-6}$ alkyl, phenyl, or benzyl.*

*62. The composition of claim 61, wherein the polymer is a copolymer comprising (i) $C_{5-20}$ cyclic olefin monomer and (ii) monomer selected from the group consisting of hydroxystyrene, acrylate, methacrylate, and combinations thereof.*

*63. The composition of claim 62, wherein the polymer is a copolymer comprising (i) $C_{5-20}$ cyclic olefin monomer and (ii) a monomer selected from the group consisting of acrylate and methacrylate.*

*64. The composition of claim 63, wherein the silylethoxy group is bonded to the acrylate or methacrylate.*

*65. The composition of claim 64, wherein the silylethoxy group is tris ($C_{1-6}$ alkyl silyl) silylethoxy.*

*66. The composition of claim 61, wherein the acid generator is iodonium triflate.*

*67. The composition of claim 61, wherein the polymer is a homopolymer of $C_{5-20}$ cyclic olefin monomer.*

*68. A composition useful as an upper layer in a bilayer resist, comprising:*

*(a) a radiation sensitive acid generator, and*

*(b) a polymer comprising a $C_{5-20}$ cyclic olefin monomer and optionally one or more monomers selected from the group consisting of acrylate, methacrylate, hydroxystyrene optionally substituted with $C_{1-6}$ alkyl, and combinations thereof, and*

*(c) a compound having an acid-cleavable silylethoxy group.*

*69. The composition of claim 68, wherein the compound of (c) is an androstane substituted with an acid-cleavable silylethoxy substituent.*

*70. A process of claim 69, wherein the ethoxy portion of the silylethoxy group is optionally substituted with $C_{1-6}$ alkyl, phenyl, or benzyl.*

*71. A composition of claim 70, wherein the silylethoxy group is tris ($C_{1-6}$ alkyl silyl) silylethoxy.*

*72. The composition of claim 68, wherein the polymer is a copolymer comprising (i) $C_{5-20}$ cyclic olefin monomer and (ii) a monomer selected from the group consisting of acrylate and methacrylate.*

*73. The composition of claim 68, wherein the polymer is a homopolymer formed by polymerizing the $C_{5-20}$ cyclic olefin monomer in the absence of additional monomers.*

*74. The composition of claim 68 being useful for imagewise exposure to radiation having a wavelength of 193 nm or 248 nm.*

*75. A composition useful as an upper layer in a bilayer resist, said composition comprising:*

*(a) a radiation sensitive acid generator; and*

*(b) a polymer comprising*

*(i) hydroxystyrene optionally substituted with $C_{1-6}$ alkyl,*

*(ii) a second monomer selected from the group consisting of acrylic acid and methacrylic acid substituted with an acid-cleavable silylethoxy group, wherein the ethoxy portion of the silylethoxy group is substituted with 0 to 4 $C_{1-6}$ alkyl, phenyl, or benzyl groups, and*

*(iii) a third monomer substituted with an acid-cleavable group.*

*76. The composition of claim 75, wherein the second monomer has the structure*

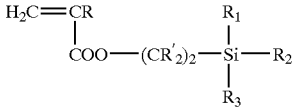

*wherein R is hydrido or methyl, the R' are independently hydrido, $C_{1-6}$ alkyl, phenyl, or benzyl, and $R_1$, $R_2$ and $R_3$ are independently selected from the group consisting of hydrido, $C_{1-6}$ alkyl and $Si(R_4)_3$ wherein $R_4$ is independently hydrido or lower alkyl.*

*77. The composition of claim 75, wherein R is methyl.*

*78. The composition of claim 75, wherein the third monomer is acrylic acid or methacrylic acid substituted with an acid-labile ester group.*

*79. The composition of claim 78, wherein the acid-labile ester group is t-butyl ester.*

*80. The composition of claim 79, wherein the R' are independently hydrido or $C_{1-6}$ alkyl.*

*81. The composition of claim 80, wherein all R' are hydrido.*

* * * * *